United States Patent
Staehler et al.

(10) Patent No.: US 7,226,862 B2
(45) Date of Patent: Jun. 5, 2007

(54) METHOD FOR PRODUCING A FLUID DEVICE, FLUID DEVICE AND ANALYSIS APPARATUS

(75) Inventors: Cord F. Staehler, Weinheim (DE); Tilo Strobelt, Villingen-Schwenningen (DE); Johannes Frech, Trossingen (DE); Peter Nommensen, Villingen-Schwenningen (DE); Martin Mueller, Dietingen (DE)

(73) Assignee: Febit Biotech GmbH, Heidelberg (DE)

( * ) Notice: Subject to any disclaimer, the term of this patent is extended or adjusted under 35 U.S.C. 154(b) by 637 days.

(21) Appl. No.: 09/873,455

(22) Filed: Jun. 4, 2001

(65) Prior Publication Data

US 2002/0068021 A1 Jun. 6, 2002

(30) Foreign Application Priority Data

Dec. 5, 2000 (DE) .............................. 100 60 433

(51) Int. Cl.
*H01L 21/302* (2006.01)
*H01L 21/461* (2006.01)
*H01L 21/20* (2006.01)
*H01L 21/36* (2006.01)
*B01L 3/02* (2006.01)

(52) U.S. Cl. ...................... 438/689; 422/50; 422/68.1; 422/81; 422/100; 422/101; 422/102; 422/103; 436/43; 436/174; 436/180; 438/14; 438/16; 438/17; 438/22; 438/48; 438/49; 438/51; 438/478; 438/455

(58) Field of Classification Search .................. 422/50, 422/55, 58, 61, 63, 68.1, 81, 82.05, 100–103; 436/43, 52, 164, 174, 180; 438/14, 16, 17, 438/22, 48, 49, 51, 478, 455, 689
See application file for complete search history.

(56) References Cited

U.S. PATENT DOCUMENTS 5,498,392 A 3/1996 Wilding et al. ............ 422/69.1

(Continued)

FOREIGN PATENT DOCUMENTS

JP WO 96/41864 12/1996

(Continued)

OTHER PUBLICATIONS

Chr. Burrer, and J. Esteve, *High-Precision BESOI-based Resonsant Accelerometer*; Sensors and Actuators; Elsevier Science S.A.; 1995.

(Continued)

*Primary Examiner*—Brian Sines
(74) *Attorney, Agent, or Firm*—Michael A. Glenn; Glenn Patent Group

(57) ABSTRACT

In the case of a method for producing a fluid device with a fluid structure having an active height, a basic wafer is provided, which comprises a supporting substrate, an insulating layer on the supporting substrate and a patterned layer on the supporting substrate, the thickness of the patterned layer determining the active height of the fluid structure. Following this, the fluid structure is produced in the patterned layer of the basic wafer, said fluid structure extending through the semiconductor layer. A transparent wafer is then applied so that the fluid structure is covered. Subsequently, the supporting substrate and the insulating layer are removed from the back so that the fluid structure is exposed at a second surface of the patterned layer. Finally, a second transparent wafer is attached to the exposed second surface of the semiconductor layer so that the fluid structure is covered. The essential parameter of the fluid device, viz. the active height of the fluid structure, need no longer be controlled making use of the etching parameters, but is already determined by the specifications of the starting material, e.g. an SOI wafer. This means that economy-priced fluid devices can be produced with high precision.

9 Claims, 1 Drawing Sheet

U.S. PATENT DOCUMENTS

| | | | |
|---|---|---|---|
| 5,744,366 A | 4/1998 | Kricka et al. | 436/63 |
| 5,783,452 A | 7/1998 | Jons et al. | 436/183 |
| 6,153,076 A | 11/2000 | Davidson et al. | 204/601 |
| 6,251,343 B1 * | 6/2001 | Dubrow et al. | 422/102 |
| 6,488,897 B2 * | 12/2002 | Dubrow et al. | 422/102 |

OTHER PUBLICATIONS

A. Benitez, J. Esteve, and J. Bausells; *Bulk Silicon Microelectromechanical Devices Fabricated From Commercial Bonded and Etched-Back Silicon-On-Insulator Substrates*; Sensors and Actuators; Elsevier Science S.A.; 1995.

* cited by examiner

METHOD FOR PRODUCING A FLUID DEVICE, FLUID DEVICE AND ANALYSIS APPARATUS

FIELD OF THE INVENTION

The present invention relates to analytics and in particular to fluid devices which are suitable for analytic applications.

BACKGROUND OF THE INVENTION AND PRIOR ART

In the field of analytics there is a great demand for fluid devices and in particular capillary paths for transporting e.g. fluids by means of capillary forces, for examining them while they are being transported or for producing sample receptacles in which the fluids stand and the surfaces of which are treated with chemical substances so that specific sample fluids will undergo a reaction with these substances, said reaction causing e.g. a change in colour of these sample fluids. In order to be able to detect such a change in colour of a sample fluid, or in order to be able to detect the optical properties of a sample fluid in general, it is important that fluid devices are transparent on both sides so that analyses can be carried out in transmitted light, e.g. by making use of fluorescent properties.

Capillary paths are nowadays used in a great variety of technical fields, e.g. in the field of chemical analytics and biochemistry. Such capillaries are etched into silicon wafers and then provided with a cover and thus closed. Although a glass cover can be used for closing such silicon-etched wafers, a substrate wafer, which is normally not optically transparent, is provided on the back, i.e. on the other side of the capillary path. Hence, such capillary paths are not suitable for transmitted-light analyses. In order to be actually able to carry out optical analyses with such capillary paths, it is necessary to apply e.g. a metal layer to the silicon-etched fluid structures, so that a reflection analysis can be carried out. In addition to the fact that such capillary paths are not suitable for transmitted-light determinations, the application of a mirror coating to the silicon is a further production step, which is complicated and which increases the costs for the fluid device.

In addition, it is difficult to adjust precise depths of the fluid structure by means of etching methods. It is true that very precisely controllable amounts of material can be removed by dry-etching techniques, but these techniques are disadvantageous insofar as the etching parameters must be controlled very precisely; this, in turn, results in high production costs for such capillary components. If the etching parameters are not strictly controlled in this way, a high reject rate will occur in the production process.

Especially in the field of analytics, disposable analysis elements are used to an increasing extent. Hence, fluid devices become more and more mass-produced articles. Especially mass-produced articles should fulfil the requirement of being economy-priced. It follows that even small differences in prices will have the effect that one product will gain more acceptance on the market than another. Only economy-priced fluid devices are therefore competitive.

SUMMARY OF THE INVENTION

It is the object of the present invention to provide an economy-priced method for producing a fluid device, and economy-priced fluid device and an economy-priced analysis apparatus.

In accordance with a first aspect of the invention, this object is achieved by a method of producing a fluid device with a fluid structure having an active height, said method comprising the following steps: providing a basic wafer comprising a supporting substrate, an intermediate layer on the supporting substrate and a patterned layer on the supporting substrate, the thickness of the patterned layer determining the active height of the fluid structure, said intermediate layer being of such a nature that it is essentially not impaired by a patterning of the patterned layer; patterning the patterned layer so as to produce the fluid structure of the fluid device, the fluid structure extending from a first surface of the patterned layer to the intermediate layer; attaching a first transparent wafer so that the fluid structure is covered; removing the supporting substrate and the intermediate layer so that the fluid structure is exposed at a second surface of the patterned layer; and attaching a second transparent wafer so that the fluid structure is covered.

In accordance with a second aspect of the invention, this object is achieved by a fluid device comprising: a patterned layer with a fluid structure, said fluid structure having an active height which corresponds to the thickness of the patterned layer; a first transparent wafer on a first surface of the patterned layer; and a second transparent wafer on a second surface of the patterned layer.

In accordance with a third aspect of the invention, this object is achieved by a method of producing a fluid device with a fluid structure having an active height, said method comprising the steps of: providing a basic wafer comprising a supporting substrate, an intermediate layer on the supporting substrate and a patterned layer on the intermediate layer, the intermediate layer being transparent and of such a nature that it is essentially not impaired by a patterning of the patterned layer, and the thickness of the patterned layer determining the active height of the fluid structure; patterning the patterned layer so as to produce the fluid structure of the fluid component, the fluid structure extending from a first surface of the patterned layer to the intermediate layer; attaching a first transparent wafer so that the fluid structure is covered; removing the supporting substrate so that the transparent intermediate layer is exposed; and attaching a second transparent wafer to the intermediate layer.

In accordance with a fourth aspect of the invention, this object is achieved by a fluid device comprising: a patterned layer with a fluid structure, said fluid structure having an active height which corresponds to the thickness of the patterned layer; a first transparent wafer on a first surface of the patterned layer; a transparent intermediate layer on the other surface of the patterned layer; and a second transparent wafer on said transparent intermediate layer.

In accordance with a fifth aspect of the invention, this object is achieved by an analysis apparatus comprising: a fluid device including a patterned layer with a fluid structure, said fluid structure having an active height which corresponds to the thickness of the patterned layer; a first transparent wafer on a first surface of the patterned layer; and a second transparent wafer on a second surface of the patterned layer or, alternatively, on a transparent intermediate layer arranged between the second wafer and the second surface of the patterned layer; a sample fluid being arranged in said fluid component; a light source for transmitting light onto the first transparent wafer of the fluid component; a light detector for detecting light that emerges from the second transparent wafer of the fluid component; and a sample fluid analyzer for determining a property of the sample fluid making use of the light emitted by the light source and detected by the light detector.

The present invention is based on the finding that, for producing a fluid device, a basic wafer is used, which comprises a supporting substrate, an intermediate layer on the supporting substrate and a patterned layer on the supporting substrate, the thickness of the patterned layer determining the active height of the fluid structure of the fluid device. Such basic wafers, which may e.g. be SOI wafers (SOI=Silicon On Insulator), are offered with precisely specified thicknesses of the semiconductor layer. In the case of SOI wafers, the intermediate layer is the insulator/oxide layer, whereas the patterned layer is the semiconductor layer.

Such basic wafers can be produced industrially as high-precision components. Since such basic wafers are offered by the industry in very high numbers of pieces, their prices are comparatively moderate, since they cannot only be used in the field of analytics but in the whole field of electronics or microstructure technology.

According to the present invention, the semiconductor layer of the basic wafer, i.e. the silicon layer in the case of an SOI wafer, is patterned so as to produce a fluid structure of the fluid device, the fluid structure extending through the semiconductor layer. The intermediate layer is implemented such that it is essentially not impaired by the patterning of the patterned layer and that—in the case of etching—it acts as an etch stop.

A transparent wafer is then applied so that the fluid structure is covered. Following this, the basic wafer is processed from the other side in such a way that the supporting substrate and the insulating layer are removed. The fluid structure is re-opened on its back in this way. Subsequently, a second transparent wafer is attached to the exposed surface of the semiconductor layer so that the fluid structure is covered.

If the intermediate layer is transparent, as in the case of $SiO_2$, it may also be retained, since it will not essentially impair the transmitted-light analysis.

One advantage of the present invention is that a fluid device which is transparent on both sides has now been created, which can easily be used for transmitted-light analyses.

A further advantage of the present invention is that it is no longer necessary to adjust the active height of the fluid structure by very precisely controlled etching parameters, this height being simply determined by the thickness of the semiconductor layer. The accuracy of the active height of the fluid structure is therefore already determined prior to the actual production of the fluid device, viz. by the thickness of the semiconductor layer specified by the manufacturer of the basic wafer.

A further advantage of the present invention is that, during the patterning of the semiconductor layer, etching methods can be used, which need not be controlled precisely. On the contrary, the insulating layer of the basic wafer automatically acts as an etch stop so that a very precise active height of the fluid structure will always be achieved independently of the etching parameters. The only requirement to be satisfied is that the semiconductor layer is fully etched through so as to achieve a fluid structure having a constant height.

Still another advantage of the present invention is that fluid devices for many different cases of use, i.e. with many different respective active heights of the fluid structures, can be obtained by means of the same production method by simply selecting different basic wafers with different thicknesses of the semiconductor layers. Since the same production method can therefore be used for a large number of different fluid devices, the production costs per fluid device will be reduced because even small batches of fluid devices having different specifications can be produced, without any complicated change-over of the production plant being necessary after each small batch.

All this is achieved due to the fact that the decisive parameter, viz. the active height of the fluid structure, is no longer determined by the production process itself, but by the starting material, viz. the basic wafer.

It follows that according to the present invention fluid devices closed on both sides thereof with transparent wafers, e.g. glass covers, can be produced with high accuracy. The accuracy is no longer-determined by the production method, but by the use of basic wafers. Due to the fact that the fluid structures are obtained by standard semiconductor-technology process steps, it is also possible to produce very complicated fluid structures with arbitrary geometries on a basic wafer so that the method according to the present invention can be used for producing not only capillary paths but also cavities, branches, passive valves and the like.

BRIEF DESCRIPTION OF THE DRAWINGS

In the following, preferred embodiments of the present invention will be explained with reference to the drawings enclosed, in which.

DETAILED DESCRIPTION OF PREFERRED EMBODIMENTS

Figure 1:
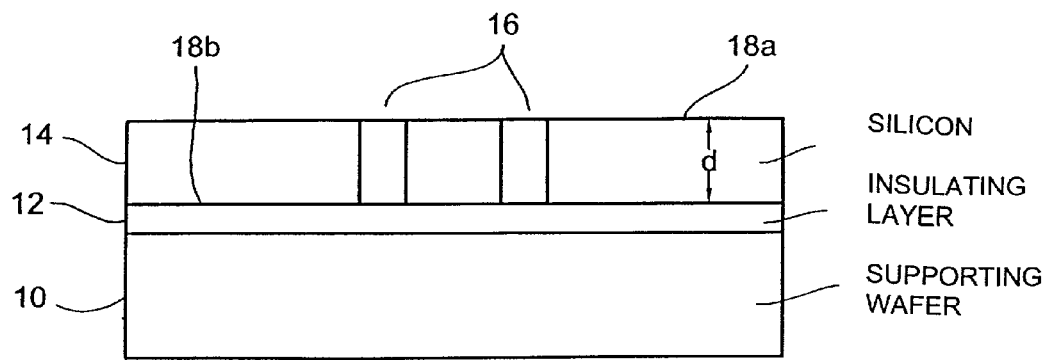
FIG. 1 shows a sectional view of a basic wafer after the step of patterning the semiconductor layer.

FIG. 1 shows a basic wafer comprising a supporting wafer 10 having applied thereto an insulating layer 12 which is, in turn, covered by a semiconductor layer 14. An SOI structure is preferably used as a basic wafer, i.e. a structure in the case of which the semiconductor layer consists of silicon, the insulating layer consists of silicon oxide, and also the supporting wafer 10 is produced from silicon. In FIG. 1, a fluid structure 16 is already shown, which is preferably produced by dry etching the silicon layer 14. As known in the field of technology, a photoresist is applied to the semiconductor layer prior to the dry-etching step; this photoresist is then exposed at the locations at which the fluid structure 16 is to be created.

The present invention is also applicable to all supporting-structure/intermediate-layer/patterned-layer systems in the case of which the intermediate layer is of such a nature that it is essentially not impaired by a patterning process used for patterning the patterned layer. The height of the active pattern is then determined by the thickness of the patterned layer alone and is not determined by the patterning method, since the intermediate layer is not impaired when the patterned layer is being patterned.

The semiconductor layer is patterned such that the fluid structure 16 extends from a first surface 18a of the silicon layer down to a second surface 18b of the silicon layer 14. The buried oxide layer 12 serves as stop layer for the dry-etching process and guarantees thus a high accuracy with respect to the future height of the fluidic structures, which is determined by the thickness of the silicon layer d, which is specified within very exacting tolerances by the manufacturer of the SOI wafer.

Figure 2:
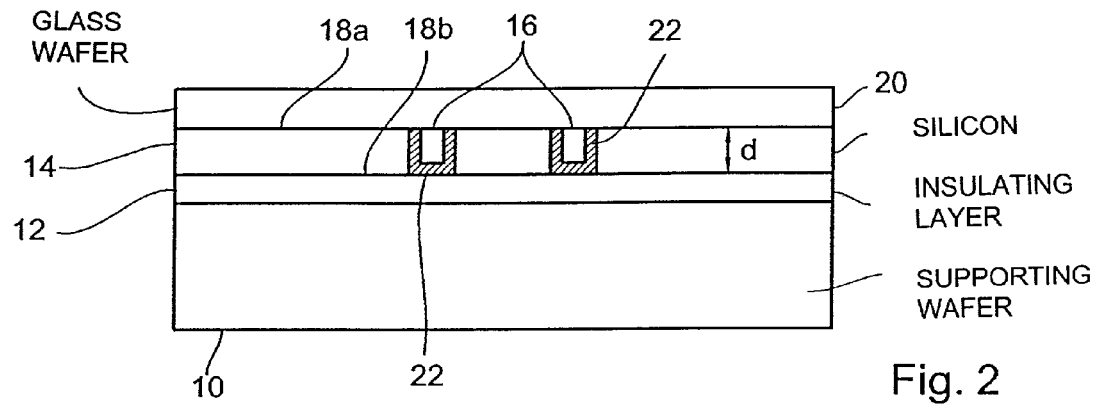
FIG. 2 shows a sectional view through a basic wafer having a first transparent wafer applied thereto.

FIG. 2 shows a sectional view through the basic wafer; now the basic wafer has, however, applied thereto a glass wafer 20 which covers the fluid structure 16. It goes without saying that, instead of the glass wafer 20, any other transparent wafer can be applied to the silicon layer 14. For attaching the transparent wafer to the silicon, anodic bonding, for which glass is most suitable, is, however, preferred.

If necessary, the fluid structure 16 can be passivated with an oxide layer, which is designated by reference numeral 22 in FIG. 2, before it is covered by the glass wafer 20. The oxide layer 22 can, however, be omitted in cases in which it is of no importance to the future arrangement whether or not the silicon is passivated.

Subsequently, the supporting wafer 10 is removed from the back by grinding, etching and the like. The oxide layer 12 serves again as a stop layer for an etching process. Subsequently, the oxide layer 12 can be removed so that the fluid structure 16 is so to speak re-opened from the back. If the oxide layer is transparent it may also be retained, that is it does not have to be removed.

For removing the intermediate layer, which acted as an etch stop, another etching method can be used, in the case of which the intermediate layer is etched while the patterned layer acts as an etch stop.

In the case of a silicon/silicon-oxide system, KOH, which does not attack silicon oxide, can be used for etching silicon, whereas hydrofluoric acid, which does not attack silicon, can be used for removing the insulating layer.

Those skilled in the art know many other material systems where two layers are provided and in the case of which one layer is not impaired when the respective other layer is being patterned.

Figure 3:
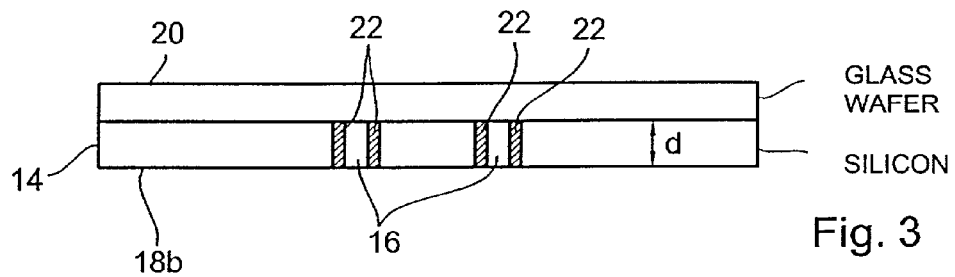
FIG. 3 shows a sectional view of the basic wafer after the removal of the supporting substrate and of the insulating layer.

This situation is shown in FIG. 3. It can be seen that by removing the supporting substrate and the insulating layer and, optionally, the passivation layer on the base of the fluid structure, the second surface 18b of the fluid structure is exposed, the active height of the fluid structure being only determined by the thickness of the silicon layer of the SOI structure.

Figure 4:
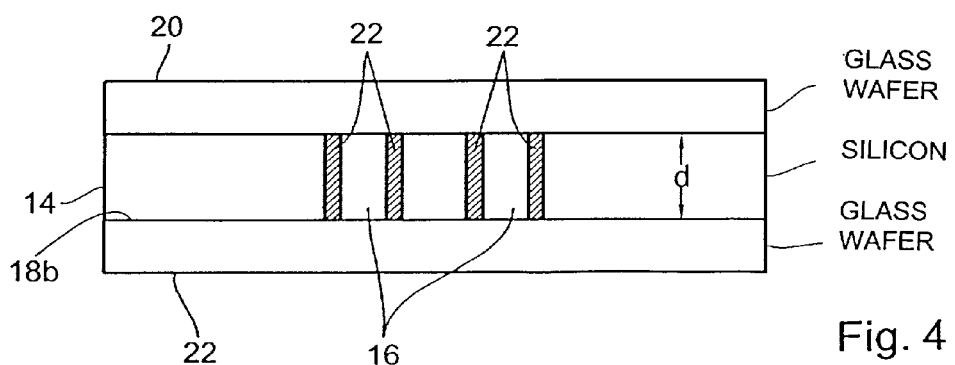
FIG. 4 shows a sectional view of a fluid device according to the present invention after the application of a second transparent wafer to the back of the fluid device.

FIG. 4 shows a finished fluid device having, in comparison with FIG. 3, only a second transparent wafer 22 attached to the second surface 18b; when silicon is used as a semiconductor layer 14, this second transparent wafer will preferably be a glass wafer as well, since this glass wafer can advantageously be connected to the silicon 14 by anodic bonding.

The fluid device shown in FIG. 4 is therefore characterized in that it has a glass cover at the top and at the bottom and that the height of the fluid structure of the fluid component, which is designated by d in the figures, corresponds to the thickness of the semiconductor layer 14.

Reference should be made to the fact that the terminals of the fluidic structures to the outside can be produced either laterally or by structuring passages in the glass wafers 20 and 22.

A preferred application of the fluid devices according to the present invention is the use these fluid devices in combination with an analysis apparatus operating with transmitted light. For this purpose, a sample fluid, which is contained in the fluid structure 16, is illuminated from above, i.e. through the first glass wafer 20, making use of a light source. After having passed through the second glass wafer, the light transmitted through the sample fluid is detected by means of a light detector. A sample fluid analyzer can then determine properties of the sample fluid making use of the spectrum of the light transmitted into the sample fluid and making use of the spectrum of the transmitted light.

The fluid devices according to the present invention can advantageously be used in the fields of in vitro diagnostics or clinical diagnostics, basic biological research, in particular genomics, forensics, food analysis or the screening of medical products.

For the individual cases of use, immobilized biomaterials, such as DNA oligonucleotides, can be arranged on the surface of the fluid structure; these immobilized biomaterials may serve as specific interaction partners, i.e. they define functional elements. When the fluid structure is designed such that rows and columns are formed, the fluid devices are also referred to as biochip arrays. Arbitrary numbers (up to several thousands) of biochemical functional elements may be arranged.

The biomaterials can be applied to the semiconductor fluid structure making use of various methods, e.g. by means of a synthesis of DNA oligos directly on the matrix making use of photolithographic masks, or by spotting synthesized oligos onto the matrix.

According to the present invention, fluid feed materials are conducted through the capillaries of the fluid device into the chip in the case of the DNA array synthesis; these fluid feed materials bond to the capillary walls due to local light activation, as described e.g. in DE 19940750 A1. A fast, efficient and consequently economy-priced production of biochips is achieved in this way so that such chips can gain acceptance as mass-produced articles. In comparison with uniform surfaces, the fluid devices according to the present invention provide more advantageous physiochemical properties of the flow and wetting processes in the fluid structures, in particular if these fluid structures are dimensioned such that they act as capillaries.

The invention claimed is:

1. A method of producing a fluid device with a fluid structure having an active height, said method comprising the following steps:

providing a basic wafer comprising a supporting substrate, an intermediate layer on the supporting substrate and a to be patterned layer on the supporting substrate, the thickness of the to be patterned layer determining the active height of the fluid structure, said intermediate layer being of such a material that it is essentially not impaired by a patterning step to pattern the to be patterned layer; p1 patterning the to be patterned layer so as to obtain a patterned layer and to produce the fluid structure of the fluid device, the fluid structure extending from a first surface of the patterned layer to the intermediate layer;

attaching a first transparent wafer so that the fluid structure is covered;

removing the supporting substrate and the intermediate layer so that the fluid structure is exposed at a second surface of the patterned layer; and attaching a second transparent wafer so that the fluid structure is covered.

2. A method according to claim 1, wherein the basic wafer is an SOI structure comprising a supporting wafer of silicon, an insulating layer of oxide as an intermediate layer and a silicon layer as a patterned layer on the oxide layer.

3. A method according to claim 2, wherein the patterning step is carried out by means of dry etching silicon, the oxide layer acting as an etch stop.

4. A method according to claim 1, wherein the first transparent wafer is a glass wafer which is attached to the patterned layer by means of anodic bonding.

5. A method according to claim 1, wherein the fluid structure is passivated by means of an oxide layer prior to the step of attaching the first transparent wafer.

6. A method according to claim 1, wherein the second transparent wafer is a glass wafer which is attached to the second surface of the patterned layer by means of anodic banding.

7. A method according to claim 1, wherein, in the step of removing the supporting substrate and the intermediate layer, the supporting substrate is removed by etching, the intermediate layer acting as an etch stop, whereupon the etching method is changed so that the intermediate layer is etched and the patterned layer acts as an etch stop.

8. A method according to claim 1, wherein the fluid device is a capillary path, the providing step including the step of selecting a basic wafer whose patterned layer has a height of such a material that a fluid to be transported in the fluid structure is transportable by capillary forces.

9. A method of producing a fluid device with a fluid structure having an active height, said method comprising the steps of:

providing a basic wafer comprising a supporting substrate, an intermediate layer on the supporting substrate and a to be patterned layer on the intermediate layer, the intermediate layer being transparent and of such a material that it is essentially not impaired by a patterning step to pattern the to be patterned layer, and the thickness of the to be patterned layer determining the active height of the fluid structure, patterning the to be patterned layer so as to obtain a patterned layer and to produce the fluid structure of the fluid component) the fluid structure extending from a first surface of the patterned layer to the intermediate layer;

attaching a first transparent wafer so that the fluid structure is covered;

removing the supporting substrate so that the transparent intermediate layer is exposed; and attaching a second transparent wafer to the intermediate layer.

* * * * *